(12) United States Patent
Tsai et al.

(10) Patent No.: US 6,882,575 B2
(45) Date of Patent: Apr. 19, 2005

(54) ERASING METHOD FOR NON-VOLATILE MEMORY

(75) Inventors: Wen-Jer Tsai, Hualian (TW); Chih-Chieh Yeh, Taipei (TW); Tao-Cheng Lu, Kaoshiung (TW); Samuel C. Pan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/790,994

(22) Filed: Mar. 1, 2004

(65) Prior Publication Data

US 2004/0170063 A1 Sep. 2, 2004

Related U.S. Application Data

(62) Division of application No. 10/289,866, filed on Nov. 6, 2002, now Pat. No. 6,829,175.

(30) Foreign Application Priority Data

Sep. 9, 2002 (TW) .................................. 91120417 A

(51) Int. Cl.[7] ................................................ G11C 7/00
(52) U.S. Cl. .............................. 365/185.29; 365/185.3; 365/218; 365/185.33
(58) Field of Search ...................... 365/185.29, 185.3, 365/218, 185.33

(56) References Cited

U.S. PATENT DOCUMENTS

| | | | | |
|---|---|---|---|---|
| 5,633,178 A | * | 5/1997 | Kalnitsky | 438/288 |
| 6,429,063 B1 | * | 8/2002 | Eitan | 438/232 |
| 6,438,031 B1 | * | 8/2002 | Fastow | 365/185.18 |
| 6,445,030 B1 | * | 9/2002 | Wu et al. | 257/315 |
| 6,477,088 B1 | * | 11/2002 | Ogura et al. | 365/185.29 |
| 6,490,205 B1 | * | 12/2002 | Wang et al. | 365/185.29 |
| 6,614,694 B1 | * | 9/2003 | Yeh et al. | 365/185.29 |
| 6,721,204 B1 | * | 4/2004 | Yeh et al. | 365/185.24 |
| 2003/0081460 A1 | * | 5/2003 | Choi et al. | 365/185.29 |
| 2003/0103384 A1 | * | 6/2003 | Takahashi | 365/185.28 |

* cited by examiner

Primary Examiner—Viet Q. Nguyen
(74) Attorney, Agent, or Firm—J.C. Patents

(57) ABSTRACT

An erasing method for the memory cells of a non-volatile memory is provided. Each memory cell comprises a gate, a source, a drain, an electron-trapping layer and a substrate. The data within the memory cell is erased by applying a first voltage to the control gate, applying a second voltage to the source, applying a third voltage to the drain and applying a fourth voltage to the substrate. The electrons are pulled from the electron-trapping layer into the channel by negative gate F-N tunneling effect.

15 Claims, 6 Drawing Sheets

ERASING METHOD FOR NON-VOLATILE MEMORY

CROSS-REFERENCE TO RELATED APPLICATION

This application is a divisional application of, and claims the priority benefit of, U.S. application Ser. No. 10/289,866 filed on Nov. 06, 2002 now U.S. Pat. No. 6,829,175.

BACKGROUND OF THE INVENTION

1. Field of Invention

The present invention relates to a method of operating non-volatile memory. More particularly, the present invention relates to an erasing method for non-volatile memory.

2. Description of Related Art

Non-volatile memory such as the electrically erasable programmable read only memory (EEPROM) is a device for holding data. Data stored inside the memory can be read or erased a multiple of times, and furthermore, the data is retained even after power is turned off. Hence, EEPROM has become one of the principal devices inside a personal computer or electrical equipment.

The floating gate and the control gate of a typical EEPROM are fabricated using doped polysilicon. To program the memory, electrons injected into the floating gate will distribute evenly over the entire polysilicon floating gate layer. However, if the tunnel layer underneath the polysilicon floating gate layer contains defects, leakage current may flow and compromise the reliability of the device.

To prevent leakage current flowing inside an EEPROM, an electron-trapping layer is often used instead of a polysilicon floating gate layer. The electron-trapping layer is a layer of silicon nitride, for example. In general, a layer of silicon oxide is also formed both above and below the electron-trapping layer to form an oxide/nitride/oxide (ONO) composite stacked gate structure. An EEPROM having a stacked gate structure is often referred to as a nitride read-only-memory (nitride ROM). When voltages are applied to the control gate and the source/drain terminals of the device in a programming operation, hot electrons generated in the channel region close to the drain will inject into the electron-trapping layer. Since silicon nitride has the special property of capturing electrons, the injected electrons will concentrate within certain local areas of the electron-trapping layer instead of distributing evenly over the entire electron-trapping layer. Due to the localization of the electrons within the electron-trapping layer, sensitivity to defects in the tunnel oxide layer is reduced and hence leakage current is greatly minimized.

Another advantage of a nitride ROM is that the source/drain terminal on one side of the stacked gate may receive a higher voltage during a programming operation so that electrons are trapped inside the silicon nitride layer close to the source/drain terminal. Alternatively, the source/drain terminal on the other side of the stacked gate may receive a higher voltage so that electrons are trapped inside the silicon nitride layer close to that side of the source/drain terminal. Thus, by varying the voltage applied to the source/drain terminal on each side of the control gate, a single silicon nitride layer may be able to host two batches of electrons, a single batch of electrons or no electrons at all. In other words, a total of four states may be written into each memory cell of a nitride ROM. That means the nitride ROM is a two bits per cell type of non-volatile memory.

A conventional nitride ROM is programmed using channel hot electrons. Hot electrons injected from the drain side (or the source side) will penetrate through the tunnel oxide layer into the electron-trapping layer and are stored locally close to the area above the drain (or the source). Since the electron-trapping layer on the drain side (or the source side) has an excess of negative charges after the programming operation, threshold voltage ($V_T$) of the memory cell will increase. These trapped electrons will remain inside the electron-trapping layer for a very long time (for example, up to 10 years at a temperature of 85° C.) unless they are purposely erased in an erasing operation. To erase the electrons from the electron-trapping layer, holes on the drain side (source side) may penetrate the tunnel oxide layer into the electron-trapping layer in a band-to-band tunneling induced hot hole injection. Since the original negative electric charges inside the drain side (or source side) electron-trapping layer are neutralized by the holes after an erasing operation, threshold voltage ($V_T$) of the memory cell will drop to re-constitute the erase state.

However, the quantity of holes injected from the drain side (or source side) into the electron-trapping layer is difficult to control if the band-to-band tunneling induced hot hole injection is utilized. Because of this, an excess of holes may be injected into the electron-trapping layer during erase and produce a so-called over-erase state in the memory device. When the degree of over-erasure is severe, reliability of the memory device may be compromised. The situation is particularly serious for a memory device having a small overall dimension. Thus, using band-to-band tunneling induced hot hole injection to carry out data erasure will ultimately limit the degree of miniaturization of memory devices.

SUMMARY OF THE INVENTION

Accordingly, one object of the present invention is to provide an erasing method for non-volatile memory capable of preventing over-erasure, improving reliability and lowering operating current.

To achieve these and other advantages and in accordance with the purpose of the invention, as embodied and broadly described herein, the invention provides an erasing method for non-volatile memory. The non-volatile memory comprises a gate, a source, a drain, an electron-trapping layer and a substrate. The method includes applying a first voltage to the gate, a second voltage to the source, a third voltage to the drain and a fourth voltage to the substrate so that electrons are pulled out from the electron-trapping layer into the channel in the erasing operation. The difference between the first voltage applied to the control gate and the fourth voltage applied to the substrate is high enough to produce a negative gate F-N tunneling effect for erasing data within the non-volatile memory. Furthermore, the second voltage applied to the source, the third voltage applied to the drain and the fourth voltage applied to the substrate have identical value so that few holes are produced inside the substrate. Consequently, stress caused by the presence of holes is minimized.

The aforementioned erasing method is equally applicable to a non-volatile memory having two bits per cell storage capacity or a non-volatile memory having one bit per cell storage capacity.

This invention also provides a method of operating a non-volatile memory. The non-volatile memory includes a gate, a source, a drain, an electron-trapping layer and a substrate. The method includes programming the non-volatile memory to a programming threshold voltage $Vt_P$. Thereafter, the non-volatile memory is set to an erased threshold voltage $Vt_E$ through a negative gate F-N tunneling effect by applying a first voltage to the gate, a second voltage to the source, a third voltage to the drain and a fourth voltage to the substrate. The difference between first voltage applied to the gate and the fourth voltage applied to the substrate is high enough to produce a negative gate F-N tunneling effect for erasing data within the non-volatile memory. Furthermore, the second voltage applied to the source, the third voltage applied to the drain and the fourth voltage applied to the substrate have identical value so that few electric holes are produced inside the substrate and stress caused by the holes is restrained.

The aforementioned operating method is equally applicable to a non-volatile memory having two bits per cell storage capacity or a non-volatile memory having one bit per cell storage capacity.

Since the negative gate F-N tunneling effect raises the threshold voltage from the initial threshold voltage Vti (the initial state) to the erase threshold voltage $Vt_E$ (the erase state), charges within the electron-trapping layer are already evenly distributed when the memory cells are in the erase state. This prevents residual holes existing in the memory cell of erased state. Furthermore, when negative gate F-N tunneling effect is used to erase data from the non-volatile memory, the erase threshold voltage $Vt_E$ is a self-limiting level and hence effectively prevents any over-erasure.

The electron-trapping layer of the memory cell contains an excess of negative charges in both the programmed state and the erased state. Hence, electron transfer always occurs no matter if the memory cell changes from a programmed state to an erased state or vice versa. Consequently, reliability problems due to hole injection are prevented.

Moreover, the positive or negative gate F-N tunneling effect is used to initialize the memory cell after fabrication. Therefore, the erase threshold voltage $Vt_E$ of the memory cell is greater than the initial threshold voltage Vti. Obviously, the initialization step may be skipped so that the erase threshold voltage $Vt_E$ of the memory cell is identical to the initial threshold voltage Vti. In this case, the process of switching the memory cell from a programmed state to an erased state or vice versa still involves only electron transfer.

In addition, the erase method according to this invention may also be applied to a memory having a P-type gate or an N-type gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
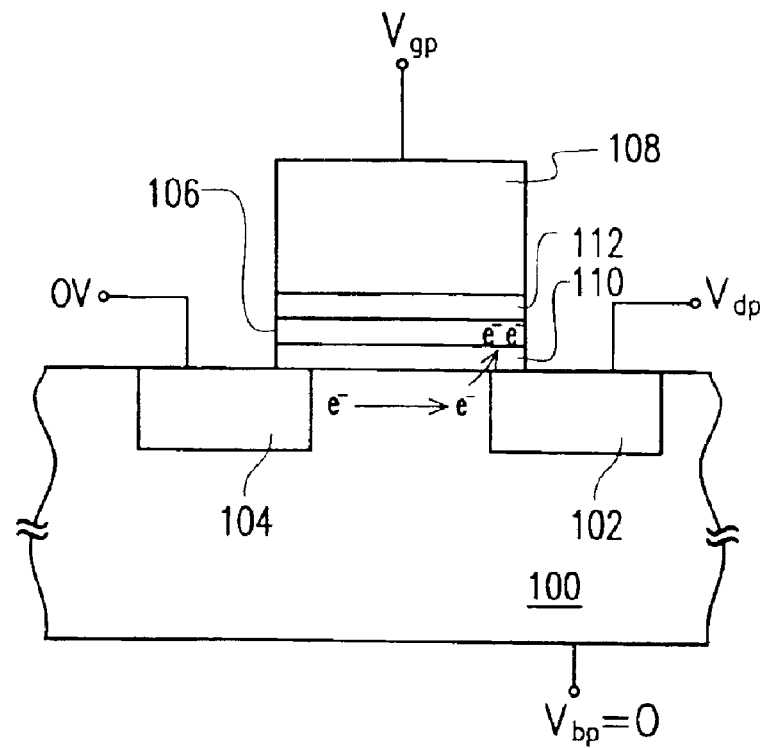
FIGS. 1A to 1C are schematic cross-sectional diagrams showing the drain side bit programming, source side bit programming and data erasing operation inside a non-volatile memory cell according to this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
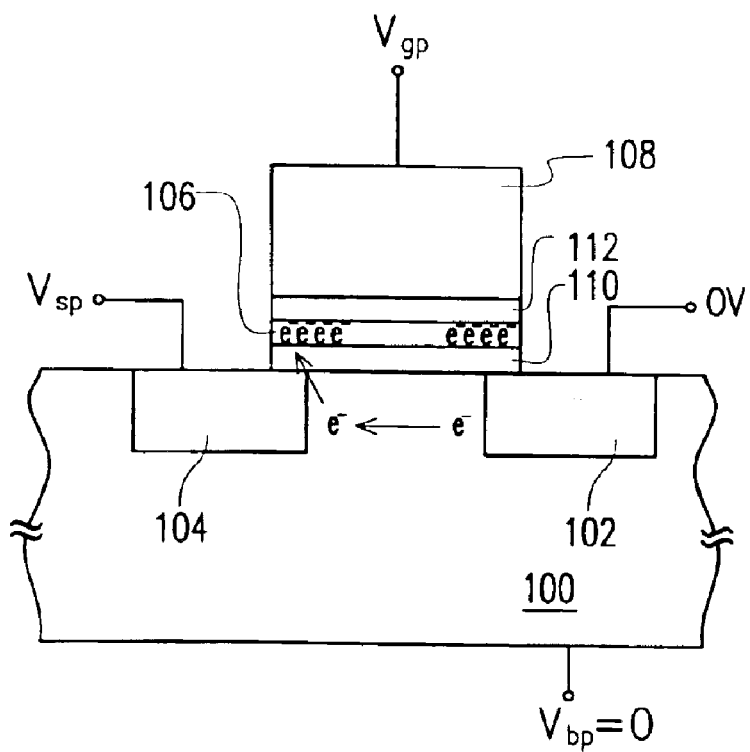
Figure 1C:
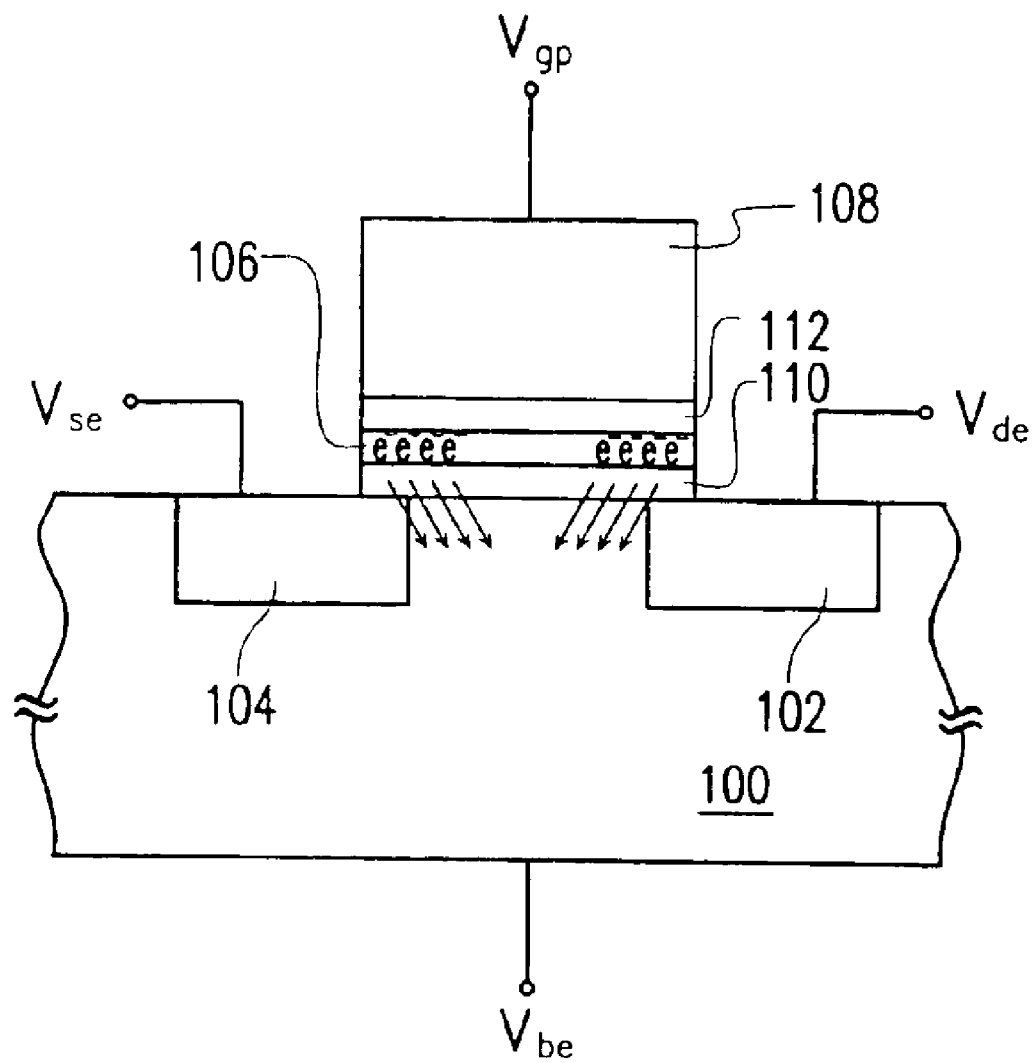
Figure 2A:
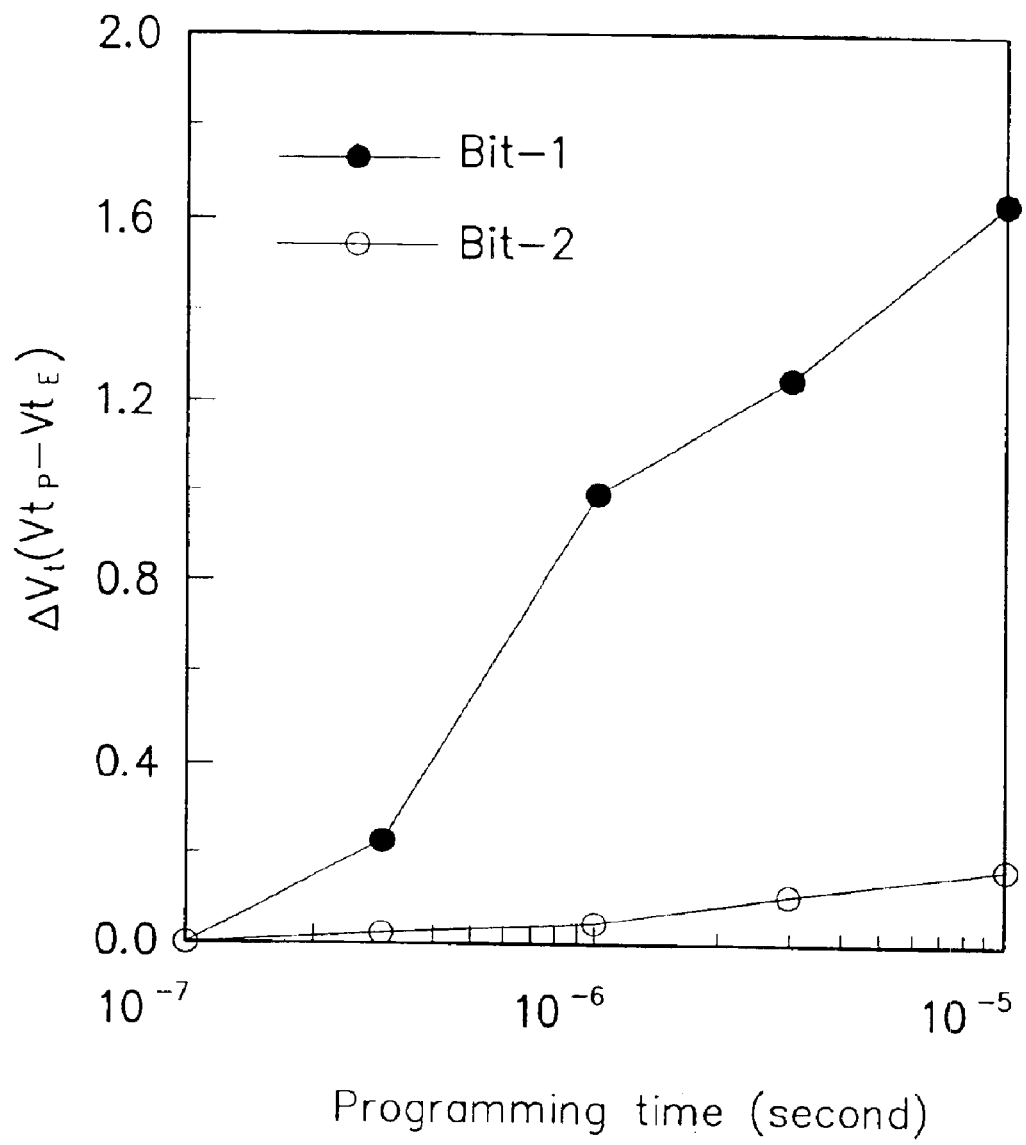
FIGS. 2A to 2C are graphs showing the relationships between threshold voltage difference $\Delta Vt(Vt_P-Vt_E)$ and time for the drain side bit programming, source side bit programming and data erasing operation $\Delta Vt(Vt_E-Vt_P)$ inside a non-volatile memory cell according to this invention.
Figure 2B:
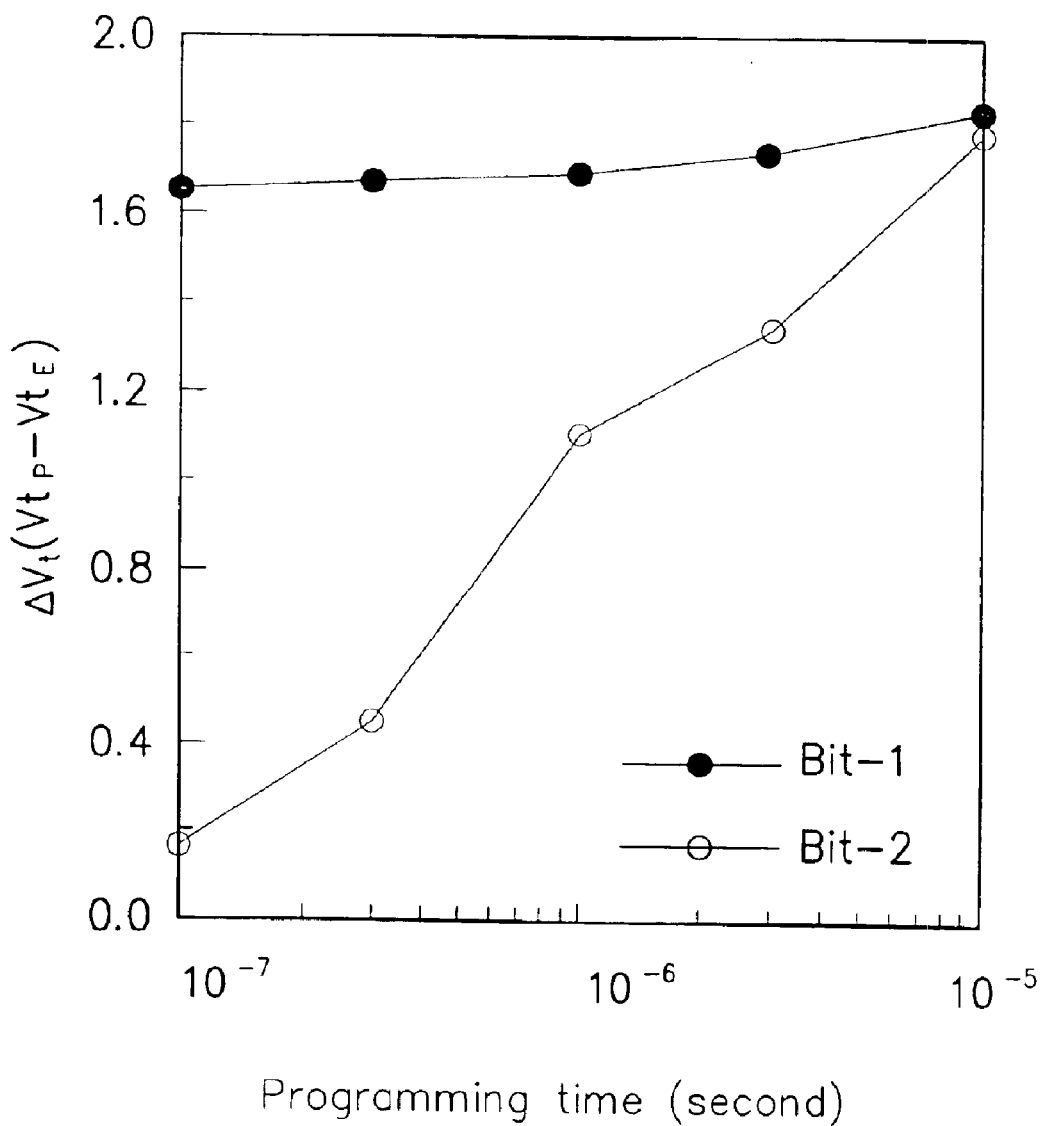
Figure 2C:
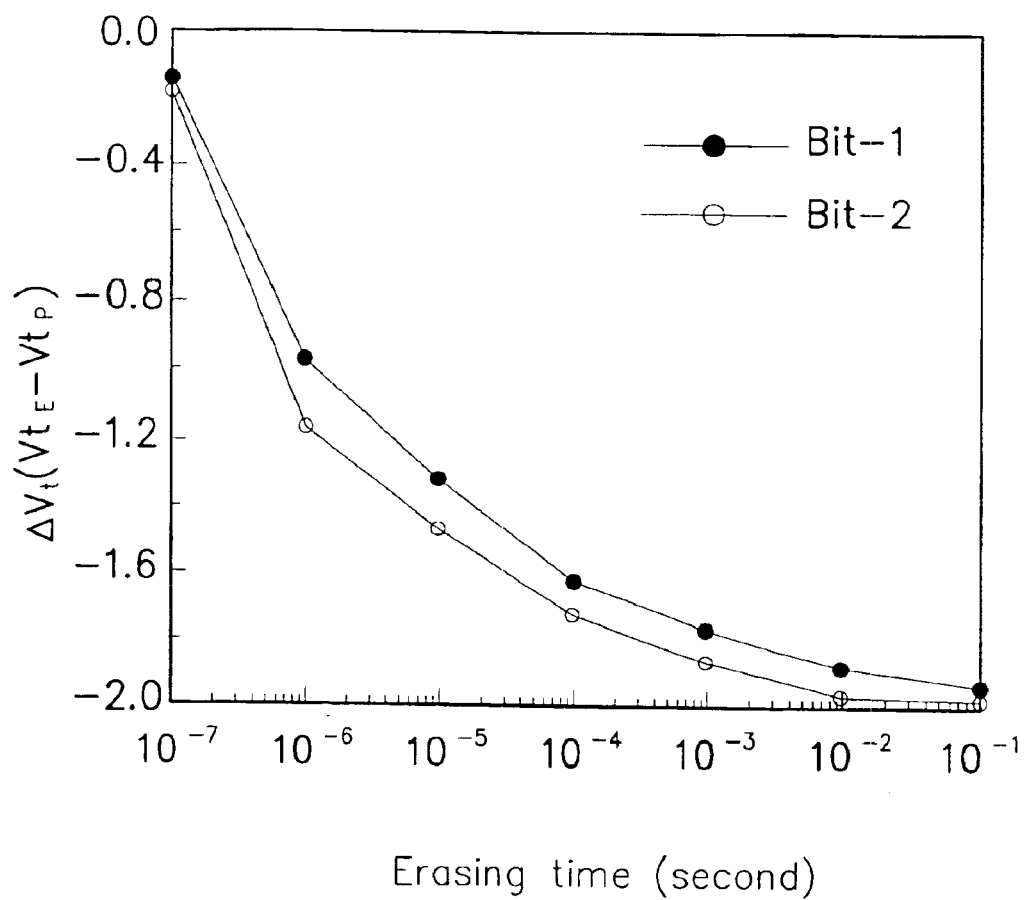

FIGS. 1A to 1C are schematic cross-sectional diagrams showing the drain side bit programming, source side bit programming and data erasing operation inside a non-volatile memory cell according to this invention. FIGS. 2A to 2C are graphs showing the relationships between threshold voltage difference $\Delta Vt(Vt_P-Vt_E)$ and time for the drain side bit programming, source side bit programming and data erasing operation $\Delta Vt(Vt_E-Vt_P)$ inside a non-volatile memory cell according to this invention. A non-volatile memory having a 2-bit per cell storage capacity is selected as an example to illustrate the embodiment of this invention. Refer to FIGS. 1A to 1C and FIGS. 2A to 2C for a better understanding of the operating modes of the non-volatile memory in this invention. In FIGS. 2A to 2C, the icon ● (Bit-1) indicates a drain side bit and the icon ○ (Bit-2) indicates a source side bit. In this embodiment, programming is carried out utilizing channel hot electron injection effect and erasure is carried out utilizing negative gate F-N tunneling effect.

As shown in FIG. 1A, each memory cell in the non-volatile memory includes a substrate 100, a drain 102, a source 104, an electron-trapping layer 106, a gate 108, a tunneling oxide layer 110 and a blocking oxide layer 112. To program the drain side bit of a memory cell, a bias voltage Vgp of about 10V is applied to the gate 108, a bias voltage Vdp of about 4.5V is applied to the drain 102, a ground voltage of 0V is applied to the source 104 and a bias voltage Vbp of 0V is applied to the substrate 100. Under this bias condition, a large channel current (0.10 mA/memory cell to 1 mA/memory cell) is generated. Electrons migrate from the source 104 towards the drain 102 and accelerate to create hot electrons by the intense channel electric field near the drain 102. Kinetic energy of the hot electrons is sufficiently high to overcome the energy barrier of the tunneling oxide layer 110. With the high positive bias voltage applied to the gate 108, the hot electrons at the drain 102 inject into an electron-trapping layer 106 and are stored within a localized region within the electron-trapping layer 106 above the drain 102. As negative charges accumulate in the electron-trapping layer 106 above the drain 102, threshold voltage of the memory cell begins to rise. In other words, the threshold voltage difference $\Delta Vt(Vt_P-Vt_E)$ of the drain side bit will increase with the programming time as shown in FIG. 2A.

Similarly, to program the source side bit of the memory cell as shown in FIG. 1B, a bias voltage Vgp of about 10V is applied to the gate 108, a bias voltage Vsp of about 4.5V is applied to the source 104, a ground voltage of 0V is applied to the drain 102 and a bias voltage Vbp of 0V is applied to the substrate 100. Under this bias condition, a large channel current is generated. Electrons migrate from the drain 102 towards the source 104 and accelerate to create hot electrons by the intense channel electric field near the source 104. Kinetic energy of the hot electrons is sufficiently high to overcome the energy barrier of the tunneling oxide layer 110. With the high positive bias voltage applied to the gate 108, the hot electrons at the source 104 inject into an electron-trapping layer 106 and are stored within a localized region within the electron-trapping layer 106 above the source 104. As negative charges accumulate in the electron-trapping layer 106 above the source 104, threshold voltage of the memory cell begins to rise. In other words, the threshold voltage difference $\Delta Vt(Vt_P-Vt_E)$ of the source side bit will increase with the programming time as shown in FIG. 2B.

To carry out an erasing operation as shown in FIG. 1C, a bias voltage Vge of between about −10V to −20V is applied to the gate 108, a bias voltage Vde and Vse of about 0V is applied to the drain 102 and the source 104 and a bias voltage Vbe of about 0V is applied to the substrate 100. Thus, a potential difference is set up between the gate 108 and the substrate 100 creating a large electric field. Subsequently, negative gate F-N tunneling effect can be utilized to pull trapped electrons inside the electron-trapping layer 106 into the channel. During the erasing operation, a reduction of electrons inside the electron-trapping layer 106 leads to a drop in the threshold voltage of the memory cell. In other words, the threshold voltage difference $\Delta Vt(Vt_P-Vt_E)$ of the source side bit or the drain side bit will decrease with the programming time as shown in FIG. 2C.

In another erasing method according to this invention, a bias voltage Vge of between about −10V to −20V is applied to the gate 108, a bias voltage Vde and Vse of between about 0V to 10V is applied to the drain 102 and the source 104 and a bias voltage Vbe of between about 0V to 10V is applied to the substrate 100 (that is, Vde=Vse=Vbe). Thus, a potential difference is set up between the control gate 108 and the substrate 100 creating a large electric field capable of pulling out trapped electrons inside the electron-trapping layer 106 into the channel. Using negative gate F-N tunneling effect to erase data has other advantages such as to operate the memory with a relatively small current.

In the method of erasing non-volatile memory according to this invention, the bias voltage Vde applied to the drain 102, the bias voltage Vse applied to the source 104 and the bias voltage Vbe applied to the substrate 100 are all at the same value. Consequently, very few hot holes are created in the substrate 100 and hence stress due to hot hole effect is suppressed. Furthermore, the set up of a large electric field between the gate 108 and the substrate 100 (that is, a large electric field penetrating through the oxide/nitride/oxide (ONO) composite layer) facilitates the expulsion of electrons stored inside the electron-trapping layer (the silicon nitride layer) through the Frenkel-Pool emission effect. Thereafter, the electrons are pulled into the channel through the F-N tunneling effect. In addition, the aforementioned erasing method also provides a symmetrical bias to the source and the drain simultaneously (that is, Vse=Vde) and thus rendering the simultaneous erasure of two bits of data previously registered inside a single memory cell possible. Obviously, the method can be applied to erase the data within a one bit per cell type of non-volatile memory.

Figure 3:
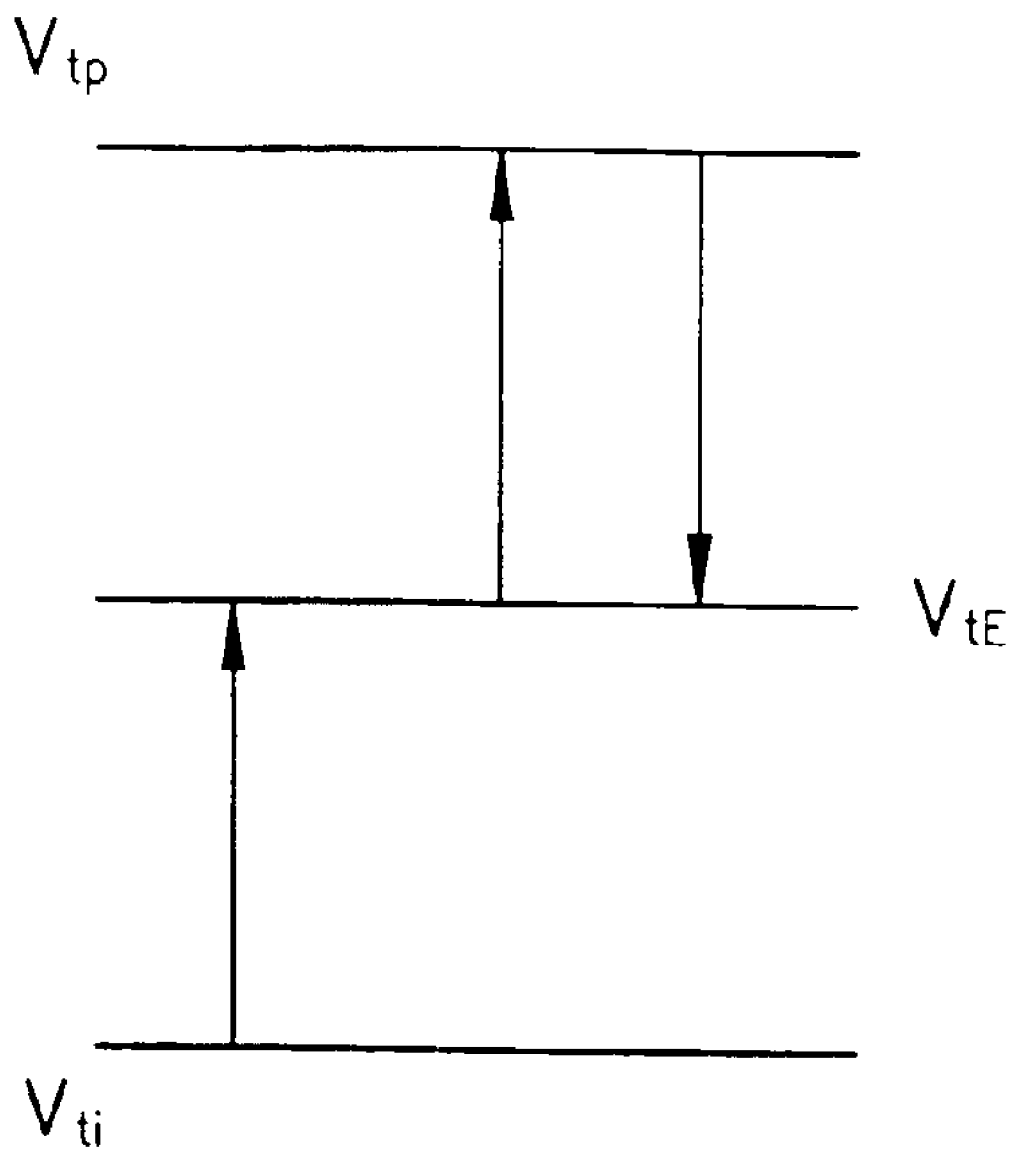
FIG. 3 is a diagram showing the threshold voltages of a non-volatile memory according to this invention.

FIG. 3 is a diagram showing the threshold voltages of a non-volatile memory according to this invention. As shown in FIG. 3, the threshold voltage of a memory cell immediately after fabrication is, for example, the initial threshold voltage Vti (for example, 1.8V). An initialization step is next carried out changing the threshold voltage of the memory cell into an erase threshold voltage $Vt_E$ (for example, 2.8V). The memory cell is initialized through the injection of electrons into the electron-trapping layer using a positive or negative F-N tunneling effect so that the threshold voltage increases from the initial threshold voltage Vti to the erase threshold voltage $Vt_E$. Alternatively, the memory cell is initialized in two stages. First, electrons are injected into the electron-trapping layer using a positive or negative F-N tunneling effect or channel hot electron injection so that the threshold voltage increases from the initial threshold voltage Vti to a programming threshold voltage $Vt_P$ (for example, 4.8V). Thereafter, an erase operation is carried out using a negative gate F-N tunneling effect to lower the threshold voltage of the memory cell from the programming threshold voltage $Vt_P$ to the erase threshold voltage $Vt_E$.

To program the memory cell, channel hot electrons are injected into the electron-trapping layer above the drain side (or source side) terminal so that the threshold voltage of the memory cell increases further from the erase threshold voltage $Vt_E$ to the program threshold voltage $Vt_P$. Thereafter, to erase data from the memory cell, the negative gate F-N tunneling effect is utilized to draw the electrons formerly injected into localized region of the electron-trapping layer out from the electron-trapping layer. Thus, the threshold voltage of the memory cell drops from the program threshold voltage $Vt_P$ back to the erase threshold voltage $Vt_E$. In subsequent operation, the threshold voltage of the memory cell is raised to the program threshold voltage $Vt_P$ or lowered to the erase threshold voltage $Vt_E$ so that the memory cell is conditioned to a programmed state or the erased state.

In the process of raising the threshold voltage from the initial threshold voltage Vti (the initial state) to the erase threshold voltage $Vt_E$ (the erase state) through the F-N tunneling effect, a layer of electric charges is evenly distributed within the electron-trapping layer. This prevents over-erasure and problems caused by the injection of excessive holes. Furthermore, the erase threshold voltage VtE in the memory cell produced by negative gate F-N tunnel effect is a self-limiting level and hence further prevents over-erasure.

Since the electron-trapping layer of the memory cell contains an excess of negative charges in both the programmed state and the erased state, electron transfer always occurs no matter if the memory cell changes from a programming state to an erasing state or vice versa. Consequently, reliability problems due to hole injection are prevented.

Moreover, the positive or negative gate F-N tunneling effect is used to initialize the memory cell after fabrication. Hence, the erase threshold voltage $Vt_E$ of the memory cell is greater than the initial threshold voltage Vti. Obviously, the initialization step may be skipped so that the erase threshold voltage $Vt_E$ of the memory cell is identical to the initial threshold voltage Vti. In this case, the process of switching the memory cell from a programmed state to an erase state or vice versa still involves only electron transfer.

In addition, the erase method according to this invention may also be applied to a memory having a P-type gate or an N-type gate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operating method for a non-volatile memory, wherein the non-volatile memory includes a gate, a source, a drain, an electron-trapping layer and a substrate, the operating method comprising the steps of:

programming the non-volatile memory to a programmed threshold voltage $Vt_p$; and setting the non-volatile memory to an erased threshold voltage $Vt_E$ by applying a first voltage to the gate, applying a second voltage to the drain, applying a third voltage to the source and applying a fourth voltage to the substrate so that electrons are pulled out from the electron-trapping layer into the channel of a memory cell utilizing a negative gate F-N tunneling effect in an erasing operation.

2. The operating method of claim 1, wherein the non-volatile memory is a two bits per cell type of memory or a one bit per cell type of memory.

3. The operating method of claim 1, wherein the control gate is an N-type gate or a P-type gate.

4. The operating method of claim 1, wherein the step of programming the memory cell of a non-volatile memory to a programmed threshold voltage $Vt_p$ includes using a channel hot electron method.

5. The operating method of claim 1, wherein before the step of programming the memory cell of the non-volatile memory to the programmed threshold voltage $Vt_p$ further includes conducting an initialization step.

6. The operating method of claim 5, wherein the initialization step includes utilizing F-N tunneling effect to increase the threshold voltage of a memory cell from an initial threshold voltage Vti to an erased threshold voltage $Vt_E$.

7. The operating method of claim 5, wherein the initialization step may further includes the sub-steps of:

programming a memory cell of the non-volatile memory so that the threshold voltage of the memory cell rises from an initial threshold voltage Vti to a programmed threshold voltage $Vt_p$; and lowering the threshold voltage of the memory cell from the programmed threshold voltage $Vt_p$ to an erased threshold voltage $Vt_E$ utilizing negative gate F-N tunneling effect.

8. The operating method of claim 7, wherein the erased threshold voltage $Vt_E$ is greater than or equal to the initial threshold voltage Vti.

9. The operating method of claim 8, wherein the fact that the erased threshold voltage $Vt_E$ is greater than or equal to the initial threshold voltage Vti indicates that the electron-trapping layer still contains an excess of negative charges in the erased state and the operation involves only electron transfer.

10. The operating method of claim 1, wherein the voltage difference between the first voltage applied to the gate and the fourth voltage applied to the substrate is between about −10V to −20V.

11. The operating method of claim 10, wherein the first voltage is set to a value between about −10V to −20V.

12. The operating method of claim 10, wherein the fourth voltage is set to a value between about 0V to 10V.

13. The operating method of claim 1, wherein the second voltage applied to the source, the third voltage applied to the drain and the fourth voltage applied to the substrate has identical value so the very few holes are produced within the substrate to cause substantial stress.

14. the operating method of claim 13, wherein the second voltage, the third voltage and the fourth voltage are set to values between about 0V to 10V.

15. the operating method of claim 14, wherein the first voltage is set to a value between about −10V to −20V.

* * * * *